United States Patent
Yin et al.

(10) Patent No.: US 8,642,471 B2
(45) Date of Patent: Feb. 4, 2014

(54) SEMICONDUCTOR STRUCTURE AND METHOD FOR MANUFACTURING THE SAME

(75) Inventors: Haizhou Yin, Poughkeepsie, NY (US); Jun Luo, Beijing (CN); Huilong Zhu, Poughkeepsie, NY (US); Zhijiong Luo, Poughkeepsie, NY (US)

(73) Assignee: The institute of Microelectronics, Chinese Academy of Science, Beijing (CN)

( * ) Notice: Subject to any disclaimer, the term of this patent is extended or adjusted under 35 U.S.C. 154(b) by 0 days.

(21) Appl. No.: 13/379,658

(22) PCT Filed: Feb. 27, 2011

(86) PCT No.: PCT/CN2011/071350
§ 371 (c)(1),
(2), (4) Date: Dec. 21, 2011

(87) PCT Pub. No.: WO2012/071813
PCT Pub. Date: Jun. 7, 2012

(65) Prior Publication Data
US 2012/0205728 A1 Aug. 16, 2012

(30) Foreign Application Priority Data
Dec. 3, 2010 (CN) .......................... 2010 1 0572608

(51) Int. Cl.
*H01L 29/78* (2006.01)
*H01L 29/94* (2006.01)

(52) U.S. Cl.
USPC ........... 438/683; 438/270; 438/275; 438/300; 438/685; 257/288; 257/384; 257/754; 257/E21.165; 257/E21.294; 257/E21.409; 257/E29.255

(58) Field of Classification Search
USPC .......... 438/270, 275, 300, 683, 685; 257/288, 257/384, 754, E21.165, E21.294, E21.409, 257/E29.255
See application file for complete search history.

(56) References Cited

U.S. PATENT DOCUMENTS

| | | | |
|---|---|---|---|
| 7,592,232 B2 | 9/2009 | Hirano | |
| 7,642,165 B2 * | 1/2010 | Shingu et al. | 438/275 |
| 7,799,682 B2 * | 9/2010 | Beyer et al. | 438/683 |
| 2001/0052648 A1 * | 12/2001 | Sakurai et al. | 257/754 |
| 2007/0108514 A1 * | 5/2007 | Inoue et al. | 257/330 |
| 2009/0023261 A1 * | 1/2009 | Hirano | 438/270 |

FOREIGN PATENT DOCUMENTS

| | | |
|---|---|---|
| CN | 1411060 A | 4/2003 |
| CN | 101536176 A | 9/2009 |

OTHER PUBLICATIONS

International Preliminary Report on Patentability and Written Opinion of the International Searching Authority for PCT/CN20111071350, Jun. 2011.
Office Action of CN 201010572608, dated May 9, 2013, Counterpart of U.S. Appl. No. 13379658.

* cited by examiner

*Primary Examiner* — Dao H Nguyen
(74) *Attorney, Agent, or Firm* — Treasure IP Group

(57) ABSTRACT

The present invention provides a method for manufacturing a semiconductor structure. The method can effectively reduce the contact resistance between source/drain regions and a contact layer by forming two contact layers of different thickness on the surfaces of the source/drain regions. Further, the present invention provides a semiconductor structure, which has reduced the contact resistance.

12 Claims, 9 Drawing Sheets

US 8,642,471 B2

SEMICONDUCTOR STRUCTURE AND METHOD FOR MANUFACTURING THE SAME

CROSS REFERENCE TO RELATED APPLICATION

This application is a National Phase application of, and claims priority to, PCT Application No. PCT/CN2011/071350, filed on Feb. 27, 2011, entitled "SEMICONDUCTOR STRUCTURE AND METHOD FOR MANUFACTURING THE SAME", which claimed priority to Chinese Application No. 201010572608.3, filed on Dec. 3, 2010. Both the PCT Application and Chinese Application are incorporated herein by reference in their entireties.

FIELD OF THE INVENTION

The present invention relates generally to the field of semiconductors and semiconductor manufacturing, and more particularly, to a semiconductor structure and methods for manufacturing the same.

BACKGROUND OF THE INVENTION

The Metal-Oxide-Semiconductor Field-Effect Transistor (MOSFET) is a kind of transistor that is widely applied in digital circuits and analog circuits. When the gate dielectric layer of a MOSFET is made of a high-k dielectric material, the gate drain current shall be effectively reduced; however, as a high-k gate dielectric layer is formed at first, the molecular structure of the high-k gate dielectric layer probably have defects. In order to remove the defects, it has to be annealed at a high temperature (600° C.-800° C.). Besides, annealing a high-k gate dielectric layer is able to enhance reliability of a transistor. However, a metal silicide layer in the transistor cannot endure the high temperature required for annealing the high-k dielectric layer, wherein the structure of the metal silicide layer is prone to change under the high temperature, such that the resistivity of the metal silicide layer increases, which thereby impedes performance of the transistor.

In the prior art, patent application US2007/0141798A1 provides a method capable of annealing a high-k gate dielectric layer without damaging a metal silicide layer, which comprises following steps:

forming a transistor with a sacrifice gate on a substrate; depositing a first interlayer dielectric layer on the substrate; removing the sacrifice gate to form a gate trench; depositing a high-k dielectric layer in the gate trench; annealing the high-k dielectric layer; depositing a first metal layer in the gate trench; depositing a second interlayer dielectric layer on the first interlayer dielectric layer and the transistor; etching the first interlayer dielectric layer and the second interlayer dielectric layer to a source and a drain to form a first contact trench and a second contact trench respectively; depositing a second metal layer into the first contact trench and the second contact trench; annealing the second metal layer to form a metal silicide layer at the source and the drain; and depositing a third metal layer to fill the first contact trench and the second contact trench.

Since a contact layer (e.g. a metal silicide layer) is formed after the high-k dielectric layer has been annealed, thus the metal silicide layer is prevented from damage under the high temperature.

However, aforesaid method though is able to protect the metal silicide layer from damage arising from annealing of the high-k dielectric layer, limitations of the method lies in that the metal silicide layer is formed nowhere but between the contact trench and the source/drain regions, thus the area of the region covered by metal silicide on the surface of the source/drain regions is limited, thus the contact resistance between the source/drain regions and the metal silicide layer of the transistor cannot be reduced adequately. Therefore, how to reduce the contact resistance between the source/drain regions and the contact layer (e.g. a metal silicide layer) becomes an issue urgent to solve.

SUMMARY OF THE INVENTION

The present invention aims to provide a semiconductor structure and a method for manufacturing the same, which are favorable for reducing the contact resistance between source/drain regions and a contact layer (e.g. a metal silicide layer).

In one aspect, the present invention provides a method for manufacturing a semiconductor structure, which comprises following steps:

a) providing a substrate, and forming a dummy gate stack on the substrate, sidewall spacers on sidewalls of the dummy gate stack, and source/drain regions at both sides of the dummy gate stack, wherein the dummy gate stack comprises a dummy gate;

b) forming a first contact layer on surfaces of the source/drain regions;

c) forming an interlayer dielectric layer to cover the first contact layer;

d) removing the dummy gate or the dummy gate stack to form an opening, filling the opening with a first conductive material or with a gate dielectric layer and a first conductive material so as to form a gate stack structure;

e) forming through holes within the interlayer dielectric layer, so that a portion of the first contact layer or a portion of the first contact layer and the source/drain regions are exposed in the through holes;

f) forming a second contact layer on the exposed portions;

g) filling the through holes with a second conductive material to form contact vias.

In another aspect, the present invention further provides a semiconductor structure, comprising a substrate, source/drain regions, a gate stack structure, an interlayer dielectric layer and contact vias;

the gate stack structure is formed on the substrate and comprises a gate dielectric layer and a gate;

the source/drain regions are formed within the substrate and positioned at both sides of the gate stack structure;

the interlayer dielectric layer covers the source/drain regions;

the contact vias comprises a second conductive material embedded into the interlayer dielectric layer and electrically connected with the source/drain regions, wherein:

a first contact layer is formed between the interlayer dielectric layer and the source/drain regions; and a second contact layer is formed between the contact vias and the source/drain regions.

As compared to the prior art, the present invention exhibits following advantages:

1) the area of a region covered by a contact layer on the surface of the source/drain regions may be increased by way of forming a first contact layer on the surface of the source/drain regions and forming a second contact layer on the first contact layer exposed by through holes or on the first contact layer and a portion of the surface of the source/drain regions, and it is thence favorable for reducing the contact resistance between the source/drain regions and the contact layer (e.g. a metal silicide layer);

2) the first contact layer exhibits thermal stability under the temperature required for annealing at formation of a gate stack structure, thus it is able to maintain a low resistance under a rather high temperature for annealing (e.g. 850° C.), therefore, the subsequent processes may be performed under a high temperature without impeding performance of the semiconductor structure;

3) the formation of the first contact layer is favorable for restraining generation of piping defect so as to reduce occurrence of short circuits in the semiconductor structure.

BRIEF DESCRIPTION OF THE DRAWINGS

Other characteristics, objectives and advantages of the present invention are made more evident according to the following detailed description of exemplary embodiment(s) and the accompanying drawings.

Same or similar reference signs in the accompanying drawings denote same or similar elements.

DETAILED DESCRIPTION OF THE INVENTION

Figure 1:
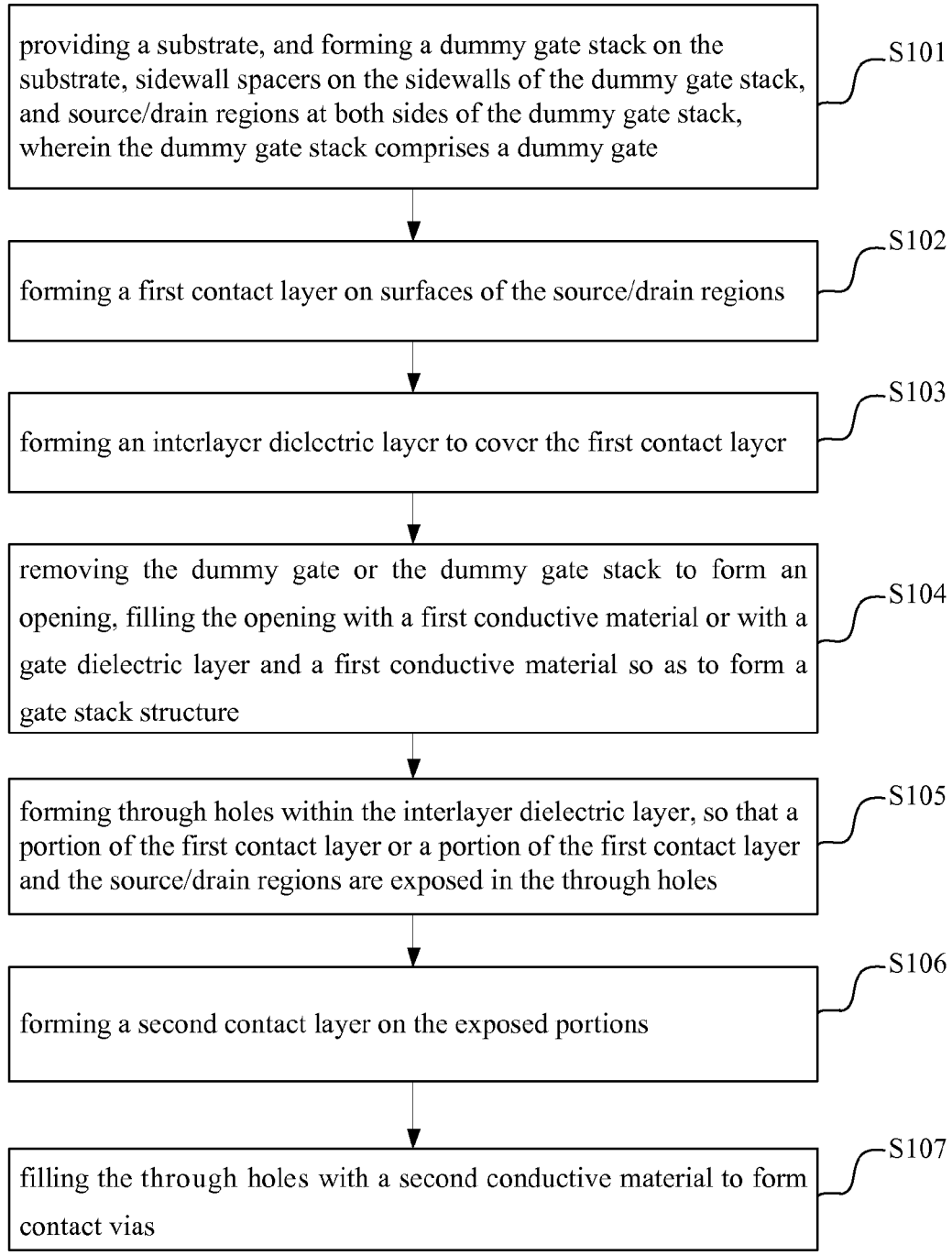
FIG. 1 is a flowchart of a method for manufacturing a semiconductor structure according to an embodiment of the present invention.

Described below in detail are preferred embodiments of the present invention, examples of which are illustrated in the drawings. The embodiments described below with reference to the drawings are merely illustrative, and are provided for explaining the present invention only, thus should not be interpreted as limitations to the present invention.

Various embodiments or examples are provided here below to implement the different structures of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clearness, and does not denote the relationship between respective embodiments and/or arrangements being discussed. Furthermore, the present invention provides various examples for specific process and materials. However, it is obvious for a person of ordinary skill in the art that other processes and/or materials may alternatively be utilized. In addition, the elements illustrated in the drawings may not be drawn to scale. The description of the widely known components and processing techniques are omitted in the present invention in order not to limit the present invention unnecessarily.

Here below, a method for manufacturing a semiconductor structure is described in detail in conjunction with FIG. 2 to FIG. 14.

Figure 2:
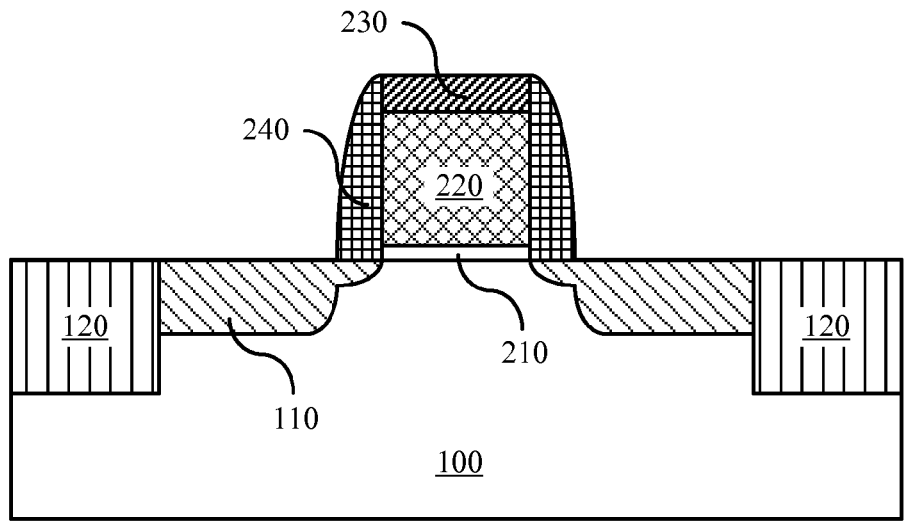
FIG. 2 to FIG. 14 illustrate cross-sectional diagrams at respective stages of the method for manufacturing a semiconductor structure in view of the flowchart shown in FIG. 1, according to preferred embodiments of the present invention.

With reference to FIG. 1 and FIG. 2, at step S101, a substrate 100 is provided, a dummy gate stack is formed on the substrate 100, sidewall spacers 240 are formed on the sidewalls of the dummy gate stack, and source/drain regions 110 are formed at both sides of the dummy gate stack; wherein the dummy gate stack comprises a first gate dielectric layer 210, a dummy gate 220 and a cap layer 230.

In the present embodiment, the substrate 100 includes a silicon substrate (e.g. silicon wafer). According to the widely known designing demands in the prior art (e. g. a P-type substrate or an N-type substrate), the substrate 100 may be of various doping configurations. Other examples of the substrate 100 may also include other basic semiconductors, for example, germanium. Alternatively, the substrate 100 may include compound semiconductors (e.g. materials of III-V classes), for example, Si:C, GaAs and InAs. Typically, the substrate 100 may have, but not limited to, a thickness of around several hundred micrometers, which may be, for example, in the range of 400 um-800 um.

Particularly, isolation regions may be formed in the substrate 100, for example, Shallow Trench Isolation (STI) structures 120, so as to electrically isolate neighboring field-effect transistor elements.

At formation of a dummy gate stack, a first gate dielectric layer 210 is formed on the substrate 100 at first; in the present embodiment, the material of the first gate dielectric layer 210 may be $SiO_2$, $Si_3N_4$ or their combination, and also may be a high-k dielectric in other embodiments, for example, a material selected from a group consisting of $HfO_2$, HfSiO, HfSiON, HfTaO, HfTiO, HfZrO, $Al_2O_3$, $La_2O_3$, $ZrO_2$, and LaAlO, or combinations thereof and its thickness may be 2-10 nm; next, a dummy gate 220 is formed on the first gate dielectric layer 210 by way of depositing, for example, a material selected from a group consisting of Poly-Si, Poly-SiGe, amorphous silicon, doped or un-doped $SiO_2$ and $Si_3N_4$, SiON, SiC and a metal, or combinations thereof and its thickness may be 10-80 nm; finally, a cap layer 230 is formed on the dummy gate 220, for example, it may be formed by way of depositing a material selected from a group consisting of $Si_3N_4$, $SiO_2$, SiON, and SiC, or combinations thereof, so as to protect the top surface of the dummy gate 220 and to prevent the top surface of the dummy gate 220 from reacting with a deposited metal during subsequent processes for forming a contact layer. The dummy gate stack is formed after aforesaid multi-layer structure is etched according to a pattern. In another embodiment, the dummy gate stack also may not incorporate a first gate dielectric layer 210; instead, a gate dielectric layer may be formed after removing the dummy gate stack in subsequent Gate Replacement Processes.

After formation of the dummy gate stack, sidewall spacers 240 are formed on the sidewalls of the dummy gate stack for isolating the gates. The sidewall spacers 240 may be formed with a material selected from a group consisting of $Si_3N_4$, $SiO_2$, SiON, and SiC, or combinations thereof, and/or any other material as appropriate. The sidewall spacers 240 may be in a multi-layer structure, and the neighboring two layers thereof may be made of different materials. The sidewall spacers 240 may be formed by means of processes including deposition and etching, and its thickness may be in the range of 10 nm-100 nm, for example, 30 nm, 50 nm or 80 nm.

The source/drain regions are positioned at both sides of the dummy gate stack and may be formed by way of implanting P-type or N-type dopants or impurities into the substrate 100. For example, for a PMOS, the source/drain regions 110 may be consisted of P-type doped SiGe; for an NMOS, the source/drain regions 110 may be consisted of N-type doped Si. The source/drain regions 110 may be formed by means of lithography, ion implantation, diffusion and/or other method as appropriate; the semiconductor structure is annealed by means of common semiconductor processing crafts and steps, so as to activate the dopants in the source/drain regions 110; annealing may be implemented by way of any method as appropriate including rapid annealing and spike annealing. In the present embodiment, the source/drain regions 110 is within the substrate 100; in other embodiments, the source/drain regions may be raised source/drain structures formed using a selective epitaxial growth method, wherein the top surface of the epitaxial portions is higher than the bottom of the dummy gate stack (the expression "the bottom of the dummy gate stack" herein refers to the interface between the dummy gate stack and the substrate 100).

Figure 3:
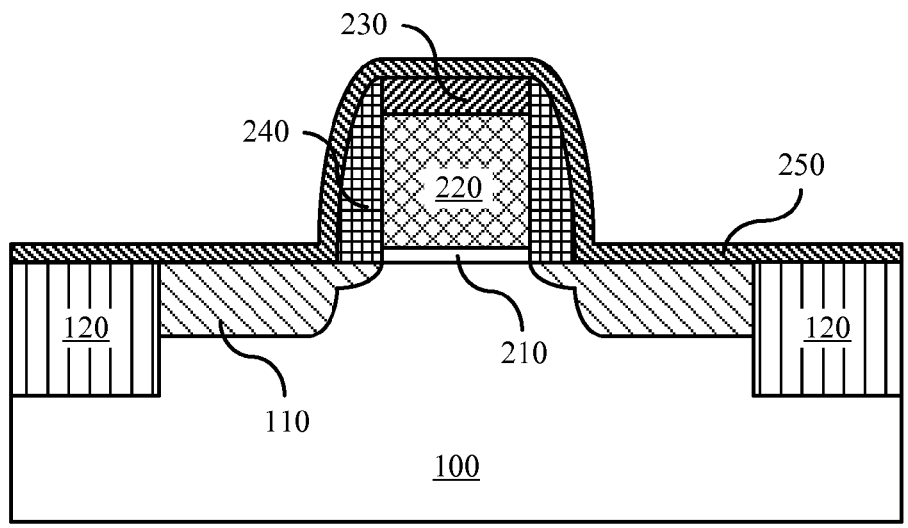
Figure 4:
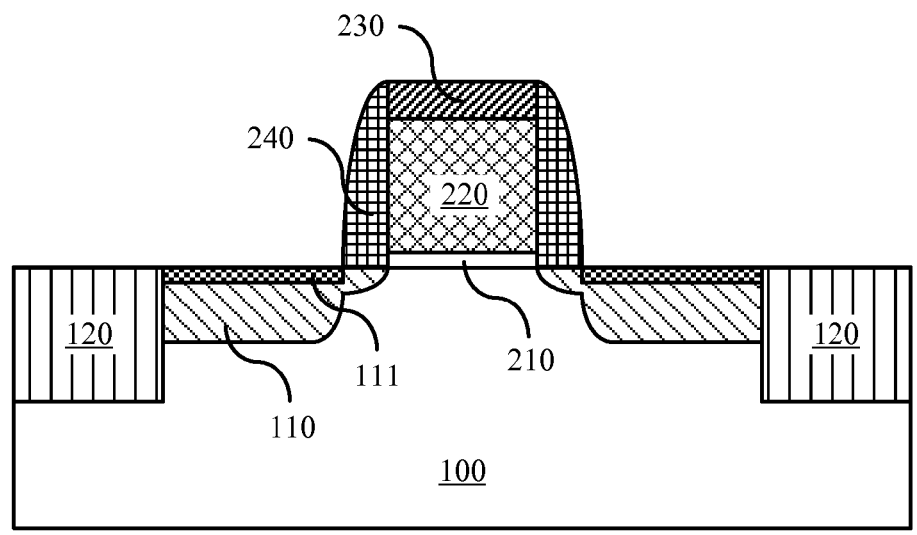

With reference to FIG. 1, FIG. 3 and FIG. 4, at step S102, a first contact layer 111 is formed on the surface of the source/drain regions 110; wherein, a metal silicide layer is formed for a Si-substrate. Here below, a Si-substrate shall be described as an example, and the contact layer is referred to as a metal silicide layer. Specifically, as shown in FIG. 3, a thin layer of a first metal layer 250 is deposited to uniformly cover the substrate 100, the dummy gate stack and sidewall spacers 240; since the first metal layer 250 reacts with silicon in the substrate after annealing, as shown in FIG. 4, the first metal silicide layer 111 is formed on the surface of the source/drain regions 110. By choosing the thickness and material of the first metal layer 250 to be deposited, the first metal silicide layer 111 to be formed shall exhibit thermal stability under a rather high temperature (e.g. 850° C.), maintain a rather low resistivity, and be favorable for alleviating decrease of resistivity of the first metal silicide layer 111 arising from annealing at a high temperature in subsequent processes for manufacturing the semiconductor structure. The material of the first metal layer 250 may be a material selected from a group consisting of Co, Ni, and NiPt, or combinations thereof.

Since the $CoSi_2$ contact layer formed from reaction of Co with Si still exhibits stability under a high temperature even when it is quite thick, thus if Co is selected as the material of the first metal layer 250, the thickness of the first metal layer 250 formed from Co may be smaller than 7 nm.

Figure 15:
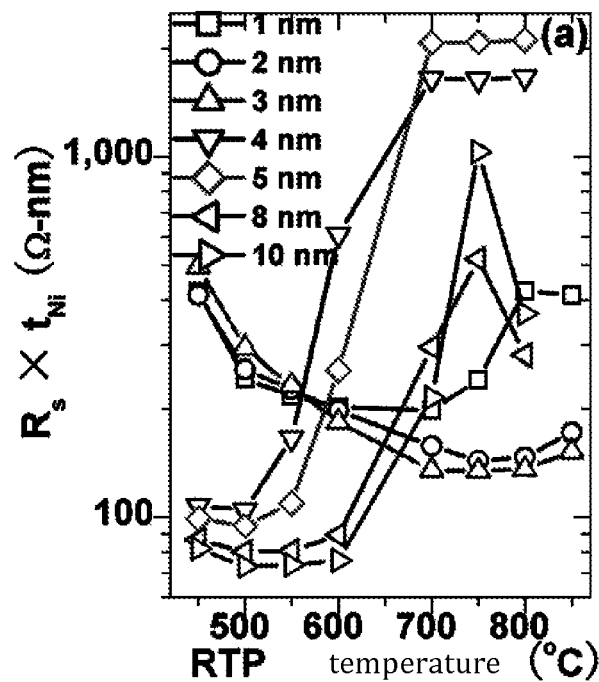
FIG. 15 illustrates resistances of Ni-silicide formed by depositing Ni layers of different thicknesses under various temperatures.

With reference to FIG. 15, which illustrates the resistances of Ni-silicide formed by depositing a Ni layer of different thickness, at different temperatures; the horizontal coordinate denotes a temperature for performing Rapid Thermal Processing (RTP), while the vertical coordinate denotes resistivity of a Ni-silicide, and different curves denote Ni layers of different thicknesses deposited at formation of Ni-silicide. As noted from FIG. 15, when the temperature for the Rapid Thermal Processing reaches 700° C., the resistivity of the Ni-silicide formed from depositing a Ni layer as thick as 2-3 nm is relatively low. Therefore, if Ni is selected as the material of the first metal layer 250, then the thickness of the first metal layer 250 formed with Ni is smaller than 4 nm, which is preferably 2-3 nm, as such the thickness of the formed first metal silicide layer 111 is substantially twice the thickness of the first metal layer. For example, when the thickness of the deposited Ni layer is 4 nm, the thickness of the formed NiSi is substantially 8 nm.

Figure 16:
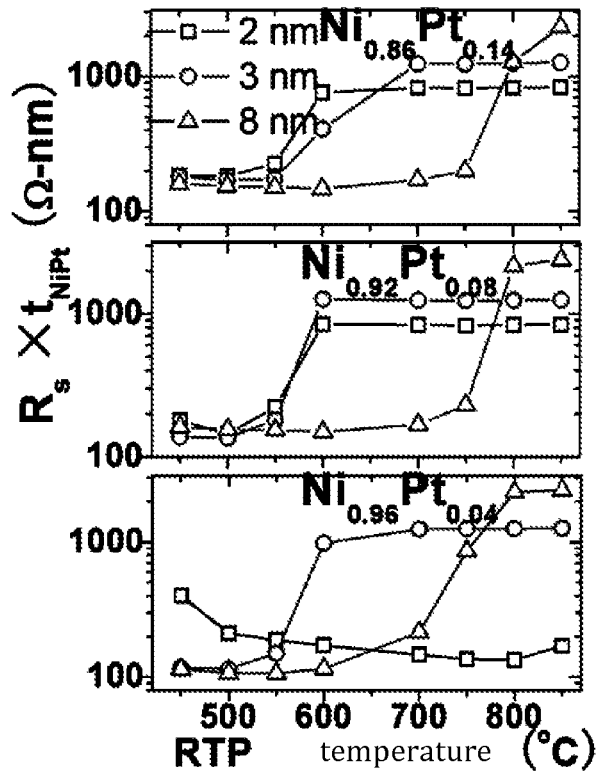
FIG. 16 illustrates the resistances of NiPt-silicide formed by depositing NiPt layers of difference thicknesses under various temperatures.

Reference is made to FIG. 16, which illustrates the resistances of NiPt-silicides formed by depositing NiPt layers of different thicknesses, at different temperatures; and which is composed of three drawings, whose horizontal coordinates all denote temperatures for performing RTP, and the vertical coordinates denote resistances of NiPt silicides. The curves in the upper drawing show resistivity of NiPt silicides formed with Ni layers of different thicknesses in the case that the first metal layer 250 is NiPt, in which the content of Ni is 86% and the content of Pt is 14%; the curves in the middle drawing denote resistivity of NiPt-silicides formed with NiPt layers of different thicknesses in the case the first metal layer 250 is NiPt, in which the content of Ni is 92% and the content of Pt is 8%; the curves in the lower drawing denote resistivity of NiPt-silicides formed with NiPt layers of different thicknesses in the case the first metal layer 250 is NiPt, in which the content of Ni is 96% and the content of Pt is 4%. As shown in FIG. 16, when the temperature for performing RTP is above 700° C., the content of Pt in the deposited NiPt layer is 4% and the thickness of the NiPt is 2 nm, the resistance of the formed NiPt-silicide is relatively low. Accordingly, when NiPt is selected as the material of the first metal layer 250, the thickness of the first metal layer formed from NiPt is smaller than 3 nm; preferably, the content of Pt in NiPt is smaller than 5%.

Research has shown that, when after the first metal layer 250 is deposited with a material selected from a group consisting of Co, Ni and NiPt, or combinations thereof, the semiconductor structure is annealed to form a first metal silicide layer 111 on the source/drain regions 110 after the annealing, wherein the first metal silicide layer 111 comprises a material selected from a group consisting of $CoSi_2$, NiSi and Ni(Pt)$Si_{2-y}$ (wherein 0<y<1), or combinations thereof; and its thickness is smaller than 15 nm, which is preferably 6 nm, the obtained first metal silicide layer 111 exhibits stability under a high temperature, and is able to endure thermal annealing under a temperature as high as 850° C. Namely, the obtained first metal silicide layer 111 exhibits thermal stability under an annealing temperature (e.g. 700° C.-800° C.) required when removing a dummy gate stack and forming a gate stack. Finally, the first metal layer 250 that has not reacted to form the first metal silicide layer 111 is removed by way of selective etching.

It is noteworthy that, in this case, at least a portion of the sidewall spacers 240 may be further removed before formation of the first contact layer 111. Particularly, in case that the first contact layer 111 is a metal silicide layer which exhibits thermal stability under an annealing temperature required for formation of the gate stack structure, since the first contact layer 111 shall further extend to the source and drain extension regions which have formerly carried the sidewall spacers 240 (i.e. a light doped drain region LDD, which is regarded as a portion of the source/drain regions 110 herein), it further extends the contact area between the source/drain regions 110 and the first contact layer 111, which is favorable for reducing the contact resistance.

And it is noticeable that, when all the sidewall spacers 240 are removed, the material for the dummy gate 220 is preferably other materials than a metal, which is favorable for separating the first metal and the dummy gate that form the first metal silicide layer 111, and maintaining the gate size as far as possible.

Figure 5:
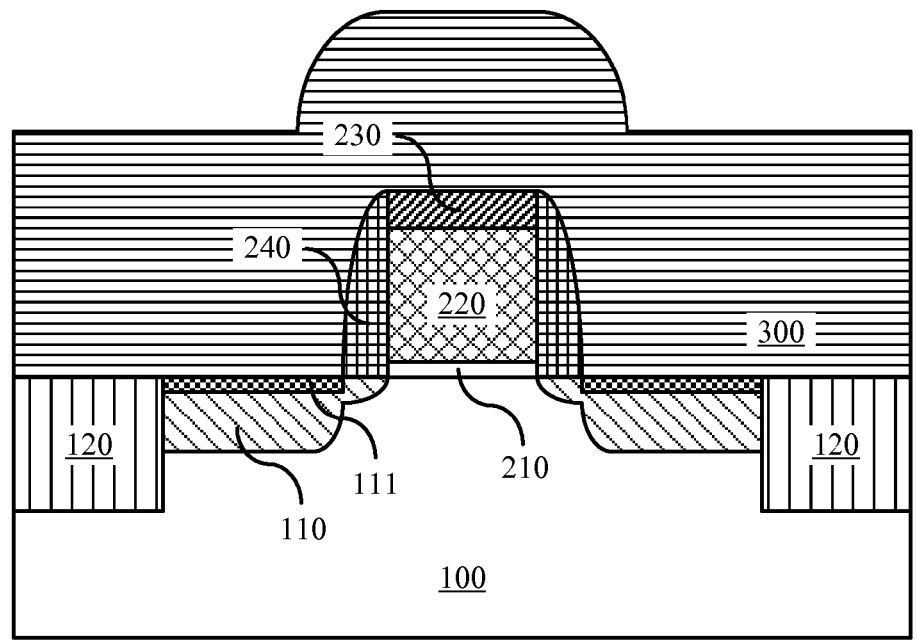

With reference to FIG. 1 and FIG. 5, at step S103, an interlayer dielectric layer 300 is deposited on the substrate 100. The interlayer dielectric layer 300 may be formed by means of Chemical Vapor Deposition (CVD), High Density Plasma CVD, spin coating and/or other method as appropriate. The material of the interlayer dielectric layer 300 may be a material selected from a group consisting of USG, doped $SiO_2$ (e.g. FSG, BSG, PSG, BPSG), and a low-k dielectric material (e.g. black diamond, coral, etc.), or combinations thereof The thickness of the interlayer dielectric layer 300 may be in the range of 40 nm-150 nm, for example, 80 nm, 100 nm or 120 nm, and may be in a multi-layer structure (neighboring layers thereof may be made of different materials).

Figure 6:
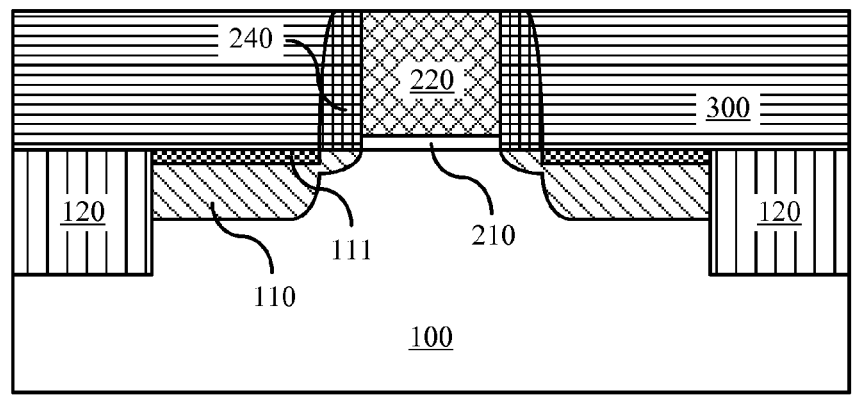
Figure 10:
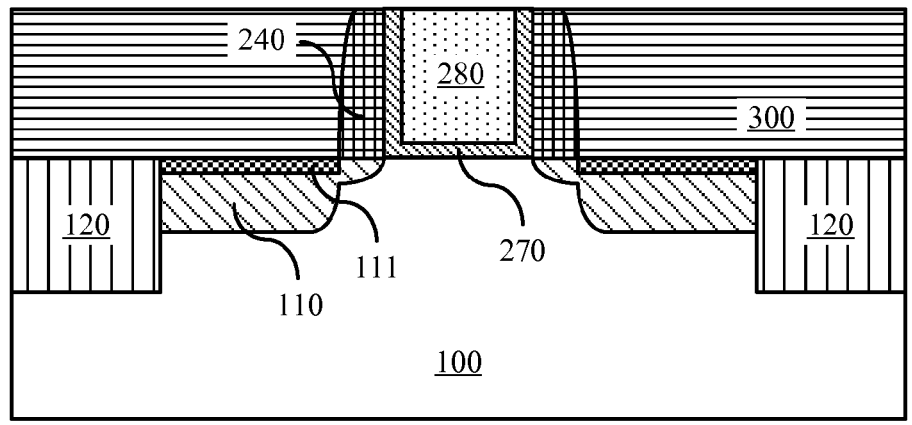

With reference to FIG. 1, FIG. 6 and FIG. 10, at step S104, the dummy gate 220 is removed to form an opening 260; then the opening 260 is filled with a first conductive material, which is preferably a metal material, to form a gate stack structure.

In the present embodiment, Gate Replacement Process is implemented. First, with reference to FIG. 6, planarization process is performed to the interlayer dielectric layer 300 and the dummy gate stack to expose the upper surface of the dummy gate 220. For example, the interlayer dielectric layer 300 may be removed by means of Chemical Mechanical Polish (CMP), and the upper surface of the dummy gate 220 and the upper surface of the interlayer dielectric layer 300 are made to be at the same level (herein, the term "at the same level" means the difference between the heights of the two is in the range of the permitted technical error).

Figure 7A:
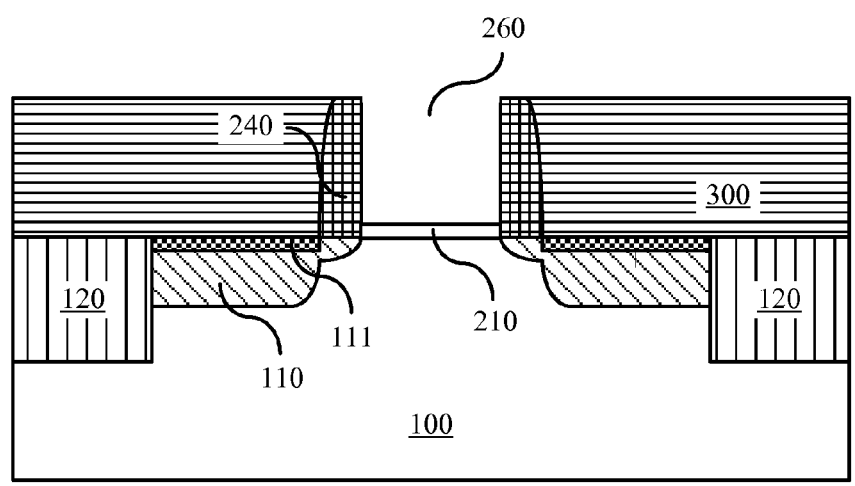
Figure 7B:
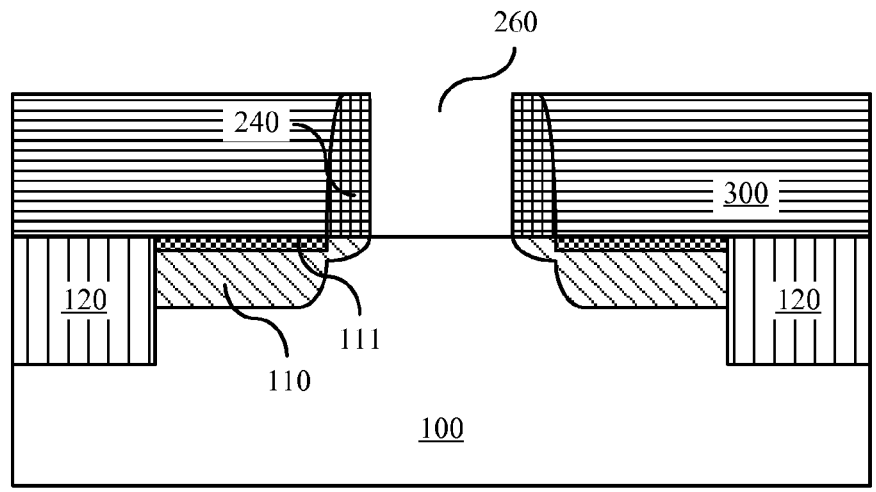

Next, the dummy gate 220 and the first gate dielectric layer 210 are removed together to expose the gate substrate 100 to form an opening 260, with reference to FIG. 7(b). The dummy gate 220 and the first gate dielectric layer 210 may be removed by means of wet etching and/or dry etching. The wet etching process may be performed with TMAH, KOH or other solution as appropriate; the dry etching process may be performed with $SF_6$, HBr, HI, Cl, Ar, He, and a carbon hydrogenate such as $CH_4$ (as well as $CH_xCl_{4-x}$, wherein $0<x<4$), $C_2H_2$, $C_2H_4$ and their combination, and/or other material as appropriate.

Figure 8:
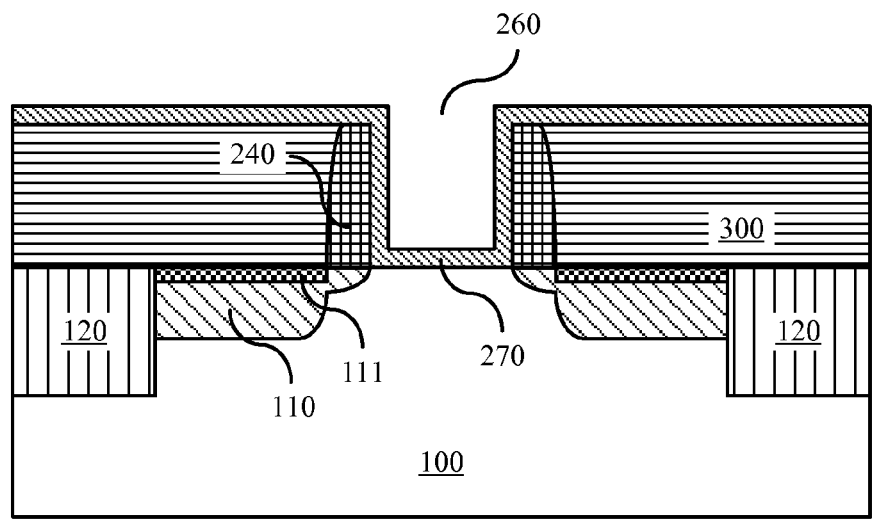

A gate dielectric layer 270 is deposited to cover the bottom of the opening 260 and the interior walls of the sidewall spacers 240, with reference to FIG. 8. The material of the gate dielectric layer 270 may be a high-k dielectric, for example, a material selected from a group consisting of $HfO_2$, HfSiO, HfSiON, HfTaO, HfTiO, HfZrO, $Al_2O_3$, $La_2O_3$, $ZrO_2$, and LaAlO, or combinations thereof, and the thickness thereof may be 2 nm-10 nm, for example 5 nm or 8 nm. The gate dielectric layer 270 may be formed by means of CVD or Atom Layer Deposition (ALD). The gate dielectric layer 270 further may be in a multi-layer structure, and comprise more than two layers made of abovementioned materials.

Annealing is further performed after formation of the gate dielectric layer 270, so as to improve performance of the semiconductor structure; and the annealing temperature is in the range of 600° C. to 800° C. Since the first metal silicide layer 111 exhibits thermal stability under a temperature as high as 850° C., thus annealing of the gate dielectric layer 270 is not prone to cause increase of resistivity of the first metal silicide layer 111, or to impede performance of the semiconductor structure.

Figure 9:
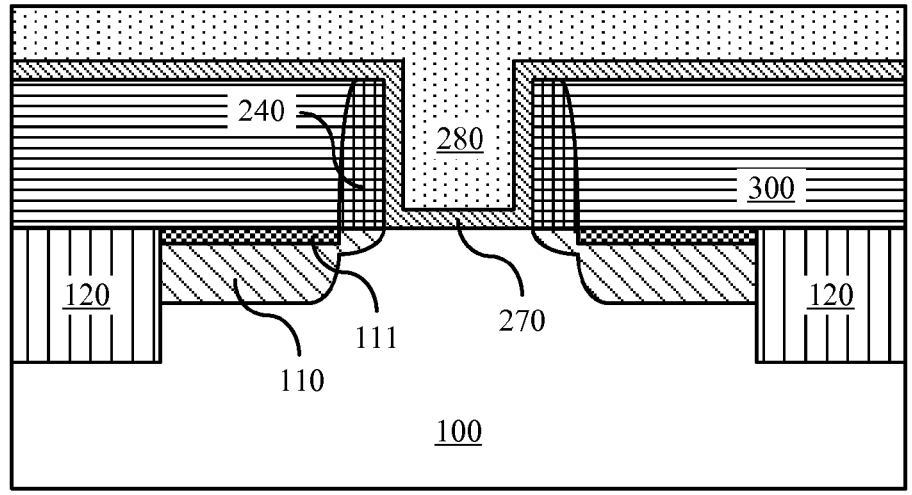

After annealing, a metal gate 280 is formed on the gate dielectric layer 270 by way of depositing a first conductive material, with reference to FIG. 9. For an NMOS, the first conductive material may be a material selected from a group consisting of TaC, TiN, TaTbN, TaErN, TaYbN, TaSiN, HfSiN, MoSiN, $RuTa_x$, and $NiTa_x$, or combinations thereof; for a PMOS, the first conductive material may be a material selected from a group consisting of $MoN_x$, TiSiN, TiCN, TaAlC, TiAlN, TaN, $PtSi_x$, $Ni_3Si$, Pt, Ru, Ir, Mo, HfRu and $RuO_x$, or combinations thereof; and its thickness may be 10 nm-80 nm, for example 30 nm or 50 nm. The metal gate 280 also may be in a multi-layer structure, and comprise more than two layers made of aforesaid materials.

In other embodiments, in case that the material of the first gate dielectric layer 210 is a high-k dielectric, for example, a material selected from a group consisting of $HfO_2$, HfSiO, HfSiON, HfTaO, HfTiO, HfZrO, $Al_2O_3$, $La_2O_3$, $ZrO_2$, and LaAlO, or combinations thereof, it is also applicable to remove the dummy gate 220 only to form an opening 260, with reference to FIG. 7(a). Next, the first gate dielectric layer 210 is annealed under a high temperature to repair the structure formed prior to formation of the first conductive material, then a metal gate 280 is formed; wherein, the processes of annealing under a high temperature and forming a metal gate are same as foregoing processes performed after forming the gate dielectric layer 270, thus they are not described here in order not to obscure.

Finally, CMP planarization process is performed to make the metal gate 280 at the same level as the upper surface of the interlayer dielectric layer 300, so as to form a gate stack structure, with reference to FIG. 10.

Figure 12:
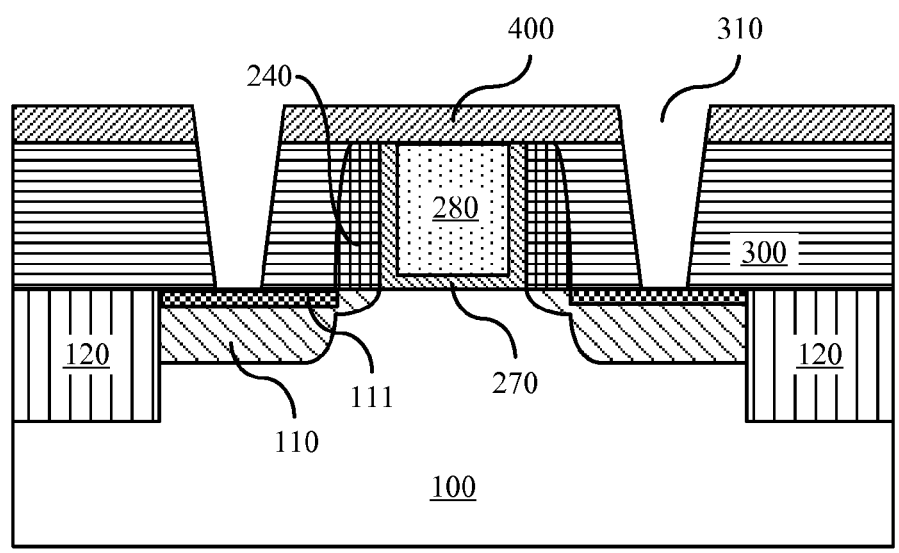

With reference to FIG. 1 and FIG. 12, at step S105, through holes 310 are formed on the source/drain regions 110. In the present embodiment, the interlayer dielectric layer 300 is etched till the source/drain regions 110 are exposed to form the through holes 310. The first metal silicide layer 111 may serve as an etch stop layer to control the etching depth of the through holes 310.

A layer of photoresist is coated on the interlayer dielectric layer 300 and the metal gate 280 before etching Then the photoresist layer is exposed and patterned to form apertures, which correspond to the position for forming the through holes 310. In the present embodiment, the interlayer dielectric layer 300 is etched by means of lithography, which is stopped at the first metal silicide layer 111 which functions as an etch stop layer, so as to form through holes 310. The material of the photoresist layer may be alkane monomer material, a material comprising nitrine quinone compound or a PE lauric acid ester, and of course may be an appropriate material selected according to the manufacturing needs. In other embodiments, the through holes 310 may be formed by means of other etching methods, for example, dry etching or wet etching The through holes 310 formed from etching may have a conical structure whose top surface is larger than its bottom.

In other embodiments, no matter un-raised source/drain regions or raised source/drain regions are implemented, when etching is stopped at a first metal silicide layer 111 that functions as an etch stop layer, the source/drain regions may be further etched using other etching solution till the bottoms of the through holes 310 reach the source/drain regions, so as to further increase the contact area between the source/drain regions and the second metal silicide layer, and to reduce the contact resistance between the source/drain regions and the metal silicide layer.

Figure 11:
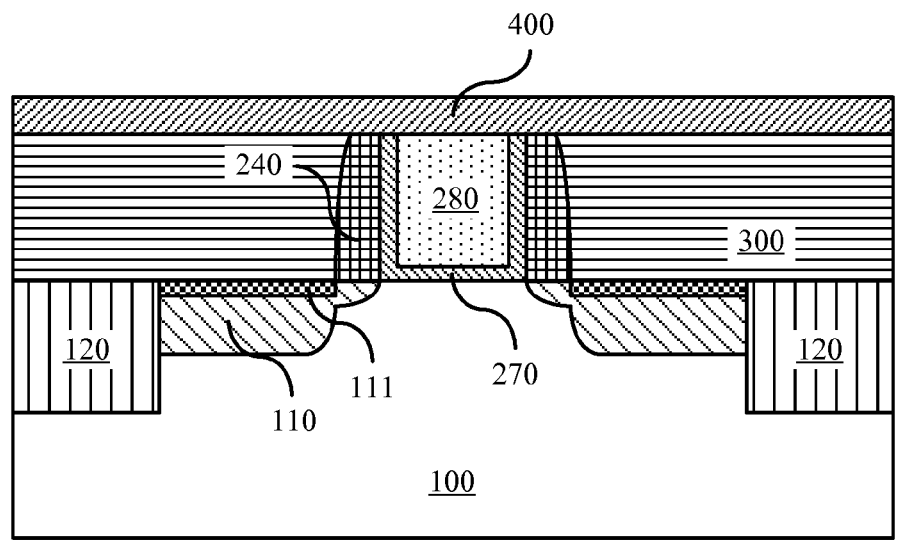

Optionally, a cap layer 400 is deposited on the interlayer dielectric layer 300 and the metal gate 280 before the through holes 310 are formed, with reference to FIG. 11. The material of the cap layer 400 may be SiN, Oxide or compound thereof, and the cap layer 400 is formed on the interlayer dielectric layer 300 and the metal gate 280 by way of CVD, High Density Plasma CVD, spin coating or other method as appropriate. In subsequent processes after formation of the semiconductor structure, the cap layer 400 is able to protect the metal gate 280 from being damaged. In this case, the material of the cap layer shall be different from the material of the interlayer dielectric layer. For example, in subsequent processes, after a second metal layer is deposited into the through holes 310 to form a second metal silicide layer, the cap layer 400 is able to effectively prevent the metal gate 280 from being etched, when the second metal layer not reacted is removed by means of selective etching.

The photoresist layer that has not reacted is removed after formation of the through holes 310.

Figure 13:
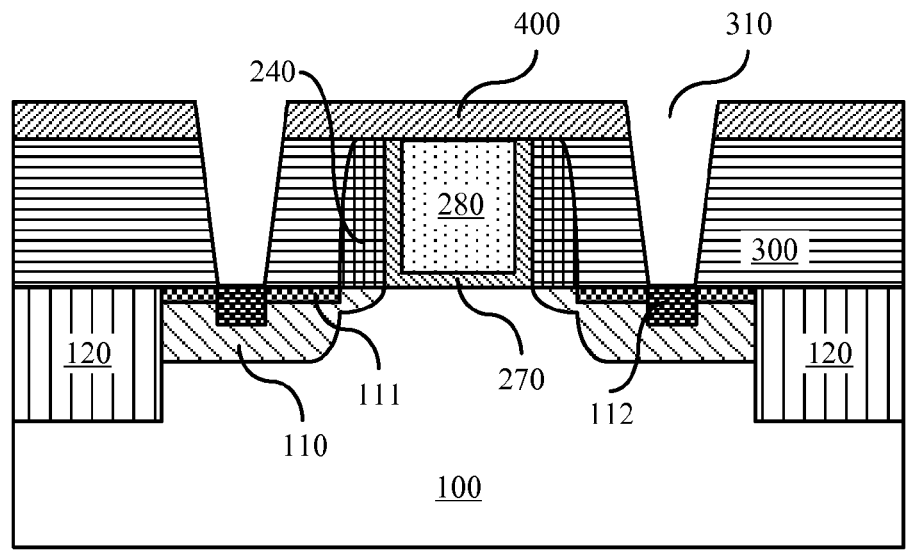

With reference to FIG. 1 and FIG. 13, at step S106, a second metal silicide layer is formed on the surface of the source/drain regions exposed through the through holes. The second metal layer may be formed at the bottoms of the through holes 310 by means of a metal sputtering or Chemical Vapor Deposition method. In the present embodiment, the material of the second metal layer may be Ni or NiPt, whose thickness may be in the range of 10 nm-25 nm. The second metal silicide layer 112 formed from reaction of the second metal layer with silicon is NiSi or Ni(Pt)Si$_{2-y}$. In other embodiments, other metal as appropriate may be used as the second metal layer. Then, the semiconductor structure is annealed, wherein annealing may be implemented by means of rapid annealing, spike annealing or other method as appropriate, such that portions of the deposited second metal layer in contact with the source/drain regions 110 will form the second metal silicide layer 112. Since the formed second metal silicide needs not go through a high-temperature process performed to a high-k gate dielectric layer, thus the second metal silicide layer needs not to exhibit thermal stability under a high temperature, therefore, it is applicable to form a second metal silicide layer much thicker than the first metal silicide layer, so as to further reduce the contact resistance; for example, it is preferred that the thickness of the formed second metal silicide layer is in the range of 15 nm-35 nm. Next, the second metal layer, which has not reacted to form the second metal silicide layer 112, is removed by means of selective etching.

In other embodiments, with regard to through holes 310 reaching into the source/drain regions 110 formed by way of etching the interlayer dielectric layer 300 and the source/drain regions 110 to expose a portion of the source/drain regions 110, a second metal silicide layer formed from deposition of a second metal layer covers the bottoms of the through holes 310 and a portion of the sidewalls of the through holes 310 formed by the exposed portions of the source/drain regions 110. The composition and the thickness of the second metal layer are same as those in the foregoing embodiments, thus they are not described here in order not to obscure.

Figure 14:
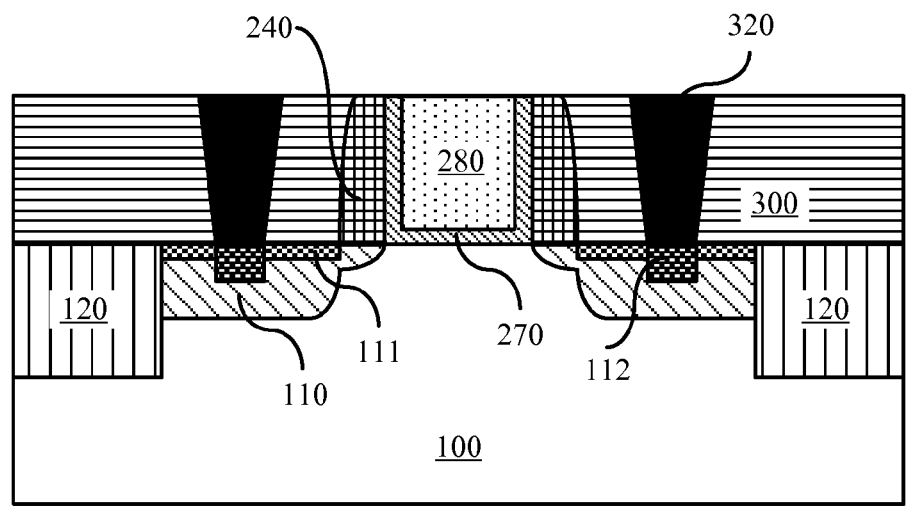

With reference to FIG. 1 and FIG. 14, step S107 is performed finally, where the through holes 310 are filled with a second conductive material, which is preferably a contact metal, so as to form contact vias 320. The contact metal may be a metal or alloy such as W, TiAl, or Al. Optionally, before the through holes 310 are filled with a contact metal, a layer of lining layer (not shown) may be deposited on all the interior walls of the through holes 310 and their bottoms by means of a deposition method such as ALD, CVD, PVD. The material of the lining layer may be a material selected from a group consisting of Ti, TiN, Ta, and TaN, or combinations thereof, and the thickness thereof is in the range of 5 nm-20 nm, for example, 10 nm or 15 nm. After the contact metal is filled in, CMP planarization process is performed to the contact metal, such that the upper surface of the contact metal is at the same level as the upper surface of the interlayer dielectric layer 300.

Then, manufacturing of the semiconductor structure is completed according to steps of the conventional semiconductor manufacturing processes.

After aforesaid steps are completely performed, two layers of metal silicide are formed in the semiconductor structure, one is the first metal silicide layer 111 positioned between the interlayer dielectric layer 300 and the source/drain regions 110, the other is the second metal silicide layer 112 positioned between the contact vias 320 and the source/drain regions 110. As compared to the prior art, the contact resistance between the source/drain regions and the metal silicide layer shall be further reduced ascribing to the addition of a contact layer (e.g. a first metal silicide layer 111); furthermore, the first metal silicide layer 111, which is formed by means of depositing a thin first metal layer 250, exhibits thermal stability even under a temperature as high as 850° C., which therefore restrains the resistivity of the first metal silicide layer 111 from increasing because of the high temperature when the first gate dielectric layer 210 made of a high-k dielectric or the gate dielectric layer 270 is annealed, after the first metal silicide layer 111 has been formed. Since the combination of the first metal silicide layer 111 and the second metal silicide layer 112 increases the contact area between the contact vias and the source/drain regions, therefore, the method for manufacturing a semiconductor structure provided by the present invention is capable of effectively reducing the contact resistance between the source/drain regions and the contact vias, and enhancing performance of the semiconductor structure. Additionally, formation of the first metal silicide layer 111 is further able to reduce piping defect and to effectively restraining occurrence of short circuits in the semiconductor structure.

In order to clearly understand the semiconductor structure manufactured according to aforesaid method for manufacturing a semiconductor structure, the semiconductor structure is described here below with conjunction to FIG. 14.

With reference to FIG. 14, which illustrates a cross-sectional diagram of a semiconductor structure completely formed according to the steps shown in FIG. 1. In the present embodiment, the semiconductor structure comprises: a substrate 100, source/drain regions 110, a gate stack structure, an interlayer dielectric layer 300 and contact vias 320. The source/drain regions 110 are formed within the substrate 100; the gate stack structure is formed on the substrate 100 and between the source/drain regions 110; the gate stack structure comprises a gate dielectric layer 270 and a metal gate 280 which is located on the gate dielectric layer 270; the interlayer dielectric layer 300 covers the source/drain regions 110; the contact vias 320 comprises a contact metal (i.e. a second conductive material) filled inside through holes 310 (with reference to FIG. 13) which goes through the interlayer dielectric layer 300 and is electrically connected with the source/drain regions 110. A first metal silicide layer 111 is formed between the interlayer dielectric layer 300 and the source/drain regions 110, and a second metal silicide layer 112 is formed between the bottoms and sidewalls of the contact vias and the source/drain regions 110.

The first metal silicide layer 111 comprises a material selected from a group consisting of CoSi$_2$, NiSi and Ni(Pt)Si$_{2-y}$, or combinations thereof, and its thickness is smaller than 15 nm, which is preferably smaller than 6 nm; the second metal silicide layer 112 comprises NiSi or Ni(Pt)Si$_{2-y}$, and its thickness may be in the range of 15 nm-35 nm; the thickness of the second metal silicide layer 112 is greater than the thickness of the first metal silicide layer 111.

In another embodiment, the source/drain regions 110 may be a raised source and drain structure, namely, the top surfaces of the source/drain regions 110 are higher than the bottom of the gate stack.

In a further embodiment, no matter un-raised source/drain regions or raised source/drain regions are implemented, the bottoms of the through holes 320 always may extend into the source/drain regions, thereby further increasing the contact area between the source/drain regions and the second metal silicide layer 112, and reducing the contact resistance of the source/drain regions and the metal silicide layer.

The structural compositions, materials and formation methods of respective portions of the semiconductor structure in the embodiments are same as those described in the embodiments of the method for forming the semiconductor structure, thus they are not described here in order not to obscure.

Although exemplary embodiments and their advantages have been described in detail, it should be understood than various alternations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor structure, comprising:
    a) providing a substrate (100), and forming a dummy gate stack on the substrate (100), sidewall spacers (240) on sidewalls of the dummy gate stack, and source/drain regions (110) at both sides of the dummy gate stack, wherein the dummy gate stack comprises a dummy gate (220);
    b) forming a first contact layer (111) on surfaces of the source/drain regions (110);
    c) forming an interlayer dielectric layer (300) to cover the first contact layer (111);
    d) removing the dummy gate (220) or the dummy gate stack to form an opening (260), filling the opening (260) with a first conductive material (280) or with a gate dielectric layer (270) and a first conductive material (280) so as to form a gate stack structure, then performing annealing operation under 600° C.-800° C.;
    e) forming through holes (310) within the interlayer dielectric layer (300), so that at least a portion of the first contact layer (111) or at least portions of both the first contact layer (111) and the source/drain regions (110) are exposed in the through holes (310);
    f) forming a second contact layer (112) on the exposed portion of the first contact layer or on said exposed portions of both the first contact layer (111) and the source/drain regions (110); and
    g) filling the through holes (310) with a second conductive material to form contact vias (320), wherein the first contact layer (111) has a thickness less than 15 nm, the thickness of the second contact layer (112) is greater than the thickness of the first contact layer (111).

2. The method according to claim 1, wherein the step of b) forming a first contact layer (111) further comprises the steps of:
    forming a first metal layer (250) on the exposed source/drain regions (110), wherein the first metal layer (250) comprises a material selected from a group consisting of Co, Ni and NiPt, or combinations thereof;
    performing a first annealing operation such that the first metal layer (250) reacts with the exposed source/drain regions (110); and
    removing the unreacted first metal layer (250).

3. The method according to claim 2, wherein
    if the material of the first metal layer (250) is Co, then the thickness of Co is less than 7 nm;
    if the material of the first metal layer (250) is Ni, then the thickness of Ni is less than 4 nm; or
    if the material of the first metal layer (250) is NiPt, then the thickness of NiPt is less than 3 nm.

4. The method according to claim 2, wherein the first metal layer (250) comprises NiPt, and the concentration of Pt in NiPt is less than 5%.

5. The method according to claim 1, further comprises a step in between the steps of d) and e), comprising:
    i) forming a cap layer (400) to cover the gate stack structure and the interlayer dielectric layer (300), wherein the material of the cap layer (400) is different from the material of the interlayer dielectric layer (300); and
    in step e), the cap layer (400) is retained on the gate stack structure when the through holes (310) are formed.

6. The method according to claim 1, wherein the second contact layer (112) comprises NiSi or Ni(Pt)Si$_{2-y}$.

7. The method according to claim 1, wherein the step f) further comprises:
    forming a second metal layer on the exposed portion of the first contact layer or on the exposed portions of both the first contact layer (111) and the source/drain regions (110);
    performing a second annealing operation so that the second metal layer reacts with the source/drain regions (110); and
    removing the unreacted second metal layer.

8. The method according to claim 7, wherein the second metal layer comprises Ni or NiPt.

9. The method according to claim 7, wherein
    the thickness of the second metal layer is in the range of about 10 nm to 25 nm.

10. The method according to claim 1, wherein the source/drain regions (110) are raised source/drain structures.

11. The method according to claim 1, wherein between forming an opening and forming a gate stack structure, step d) further comprising:
    performing a third annealing operation to repair the structure formed before formation of the first conductive material.

12. The method according to claim 1, wherein before the step of formation of the first contact layer (111), further comprising: removing at least a portion of the sidewall spacers (240).

* * * * *